US006977513B2

(12) United States Patent
Matsunaga

(10) Patent No.: US 6,977,513 B2
(45) Date of Patent: Dec. 20, 2005

(54) CURRENT DETECTION CIRCUIT OF BIDIRECTIONAL SWITCH

(75) Inventor: Shinichiro Matsunaga, Matsumoto (JP)

(73) Assignee: Fuji Electric Holdings Co., Ltd., Kawasaki (JP)

( * ) Notice: Subject to any disclaimer, the term of this patent is extended or adjusted under 35 U.S.C. 154(b) by 0 days.

(21) Appl. No.: 10/998,799

(22) Filed: Nov. 30, 2004

(65) Prior Publication Data
US 2005/0189981 A1 Sep. 1, 2005

(30) Foreign Application Priority Data
Dec. 2, 2003 (JP) .............................. 2003-403308

(51) Int. Cl.[7] .......................... G01R 27/08; H02J 7/00
(52) U.S. Cl. ..................................... 324/713; 320/134
(58) Field of Search .............................. 324/713, 691, 324/649, 609, 415, 522, 600; 320/124, 125, 320/127, 128, 132, 134, 136, 162, 164; 323/272, 323/277, 282, 353; 327/16, 30, 96, 50–54; 363/78, 89

(56) References Cited

U.S. PATENT DOCUMENTS

| | | | | |
|---|---|---|---|---|
| 5,428,523 A | * | 6/1995 | McDonnal | 363/71 |
| 5,606,242 A | * | 2/1997 | Hull et al. | 320/106 |
| 5,847,912 A | * | 12/1998 | Smith et al. | 361/93.1 |
| 5,977,751 A | * | 11/1999 | Blessing et al. | 320/134 |
| 6,150,797 A | * | 11/2000 | Mukainakano | 320/134 |
| 6,404,173 B1 | * | 6/2002 | Telefus | 323/272 |
| 6,429,641 B1 | * | 8/2002 | Montrose | 324/123 C |
| 6,621,255 B2 | * | 9/2003 | Telefus | 323/272 |
| 2005/0012689 A1 | * | 1/2005 | Abdoulin | 345/60 |
| 2005/0151543 A1 | * | 7/2005 | Taylor | 324/609 |

FOREIGN PATENT DOCUMENTS

JP 11-069635 3/1999

* cited by examiner

Primary Examiner—Anjan Deb
Assistant Examiner—Hoai-An D. Nguyen
(74) Attorney, Agent, or Firm—Rabin & Rabin, P.C.

(57) ABSTRACT

A bidirectional main switch includes two main switches M1 and M2 formed of two main MOSFET'S Q1 and Q2, respectively; a bidirectional mirror switch including two mirror switches M3 and M4 formed of two mirror MOSFET'S Q3 and Q4, respectively, both being formed so as to allow a small current (a mirror current) to flow therein in a specified ratio to a current in the main MOSFET'S Q1 and Q2; and an operational amplifier Op1 forming feed back amplifying circuit having power supplied from two power sources. Thus, a bidirectional current flowing in the bidirectional main switch for cutting off an excessive charge current and an excessive discharge current of a battery E can be detected by a simple circuit with low power losses and a high accuracy.

28 Claims, 5 Drawing Sheets

CURRENT DETECTION CIRCUIT OF BIDIRECTIONAL SWITCH

CROSS-REFERENCE TO RELATED APPLICATION

This application claims benefit of JP PA 2003-403308, filed on Dec. 2, 2003, the entire disclosure of which is entirely incorporated herein by reference.

BACKGROUND OF THE INVENTION

1. Field of the Invention

The present invention relates to a current detection circuit of a bidirectional switch which monitors a charge current and a discharge current of a direct current power source such as a rechargeable battery, and protects the direct current power source by cutting off any excessive charge current and any excessive discharge current.

In the drawings, the same reference numerals and signs denote the same or equivalent parts.

2. Description of Related Art

FIG. 3 is a diagram showing an example of a configuration of the simplest related current detection circuit of such a kind. In the diagram, a MOSFET Q1, acting as the main switch, carries out on-and-off switching of the flow of a load current Im, which is the object of detection. In series to the MOSFET Q1, a high-accuracy sensing resistor Rs is inserted. A voltage across the sensing resistor Rs is observed in order to detect the current Im. In this circuit, however, when the current Im to be detected is particularly large, the large amount of power lost in the sensing resistor Rs becomes a problem. In practice, the gate of the MOSFET Q1 is attached to a control circuit (not shown).

FIG. 4 illustrates a device for detecting a load current Im with low power loss. In the device shown in FIG. 4, a current mirror circuit is formed by providing two N-channel MOSFET's Q1 and Q3. The N-channel MOSFET Q1 acts as a main switch, in which the load current Im flows. The N-channel MOSFET Q3 acts as a mirror switch. It has a gate potential made equal to that of the N-channel MOSFET Q1 and has its W (channel width) length being 1/n of that of the MOSFET Q1. In this mirror circuit, a negative feed back circuit is provided that uses an element with a high input impedance (in the example, an operational amplifier Op1) so that a voltage across the N-channel MOSFET Q1 and a voltage across the N-channel MOSFET Q3 are made equal to each other. In the negative feed back circuit, a sensing resistor Rs is inserted between the output terminal of the operational amplifier Op1 and the drain of the N-channel MOSFET Q3 to cause a mirror current Is to flow with an exact magnitude Im×(1/n) in the sensing resistor Rs. The ratio can be the result of the physical dimensions of the MOSFET's, e.g., the ratio of widths W.

The mirror current Is is sufficiently small, compared with the load current Im, to cause a very small loss when being detected. The mirror current Is is accurately detected by an element with a low input impedance (in the example, an operational amplifier Op1) and the sensing resistor Rs, by which the current Im in the main FET Q1 can be accurately detected.

In the current detection systems shown in FIGS. 3 and 4, the direction of the current Im flowing in the main switch is fixed. Thus, with these systems, it is impossible to detect a current flowing in either direction, to provide a charge and discharge protection switch.

FIG. 5 is a diagram showing an example of an ordinary configuration of the main switch section of a charge and discharge protection switch (bidirectional switch) for cutting off an excessive charge current, and also an excessive discharge current, of a battery E. In the diagram, two main switches M1 and M2 are inserted in a charge/discharge current path on the side of the negative terminal of the battery E. Each of the switches M1 and M2 is made of an N-channel MOSFET, which is a device that naturally contains a parasitic (or, inherent) diode (D1 and D2 respectively). In the illustrated example, the inserted main switches M1 and M2 are connected in series with their polarities reversed to each other, so that the source terminals of the main switches M1 and M2 are at both ends of the series connection.

Here, with the main switch M1 driven to be turned-on and the main switch M2 driven to be turned-off, a charge current of the battery E can be cut off; and, with the main switch M1 driven to be turned-off and the main switch M2 driven to be turned-on, a discharge current of the battery E can be cut off.

An example of a detection system for current flowing in either direction in such a bidirectional switch is disclosed in JP-A-11-69635. This document discloses a circuit configuration in which a sensing resistor inserted in a current path is changed to a sensing resistor with a value suited for current detection, depending on the magnitude of a charge current or a discharge current flowing in the current path. In this circuit, a voltage across the sensing resistor is detected by an operational amplifier so that an accurate current detection voltage is obtained with little influence of the offset of the operational amplifier, while reducing power loss in the sensing resistor.

Also, in JP-A-2003-215172, a charge and discharge current detection circuit is disclosed which enables detection of a charging current and a discharge current to be carried out under the same operating condition. In the detection circuit disclosed in this document, characteristics factors of an amplifying circuit are made to similarly affect the detection of the charging current and detection of the discharge current, to enable accurate comparison of them with easy offset adjustments.

The system disclosed in JP-A-11-69635, however, involves a problem, in that the value of the sensing resistor must be selected according to the current output specifications of the device for reducing a power loss in the sensing resistor and increasing the sensing voltage across the sensing resistor. Furthermore, in the system in JP-A-11-69635, there are some losses caused in the sensing resistor inserted in the charge and discharge current path, which still remains as a problem.

It is an object of the present invention to solve the problems described above and to provide a current detection circuit of a bidirectional switch that can accurately detect a charge current and a discharge current with low power loss, by a simple circuit.

SUMMARY OF THE INVENTION

The invention relates to a current detection circuit with a bidirectional switch, where the circuit detects a current in the bidirectional switch with low loss and high accuracy, without inserting a sensing resistor directly in the current path of the bidirectional switch.

In order to solve the above problems, a current detection circuit of a bidirectional switch according a first aspect of the invention is provided so as to include:

two main transistors each having a parasitic diode connected thereto in parallel, with respective polarities being reversed to each other;

two mirror transistors each having a parasitic diode connected thereto in parallel, with respective polarities being reversed to each other;

a feedback amplifying unit having two high impedance input ends and an output end;

a sensing resistor; and a current detecting unit (a difference voltage detector), in which the two main transistors (M1, M2) are in a series connection with their respective polarities being reversed to each other to form a bidirectional switch, the two mirror transistors (M3, M4) are in a series connection with their respective polarities being reversed to each other in the same way as the two main transistors and with each control electrode (such as a gate electrode G1,G2) being connected to a control electrode (such as a gate electrode) of the main transistor with the same polarity, each of the two mirror transistors is formed so as to allow a current, smaller than a current flowing in the main transistor with the same polarity, to flow in a specified mirror ratio under a condition under which electric potentials of main electrodes (such as a source electrode and a drain electrode) are made equal to those of corresponding main electrodes of the main transistor with the same polarity, the series connection of the two main transistors is inserted in a current path of a main direct current power source (such as a battery E) with both of one end (such as a source of one of the main transistors) of the series connection of the two main transistors and one end (such as a source of one of the mirror transistors) of the series connection of the two mirror transistors being connected to one of electrodes (such as a negative electrode) of the main direct current power source, the feedback amplifying unit has the two high impedance input ends, one connected to the other end (such as a source of the other main transistor) of the series connection of the two main transistors and the other end (such as a source of the other mirror transistor) of the series connection of the two mirror transistors, respectively, with the output end being connected through the sensing resistor (Rs) to the input end that is connected to the other end (such as a source of the other main transistor) of the series connection of the two mirror transistors, allows the two high impedance input ends to input electric potentials at the other ends of the respective series connections, and allows the output end to input and output the smaller current in the specified mirror ratio from and to the other end of the series connection of the two mirror transistors through the sensing resistor so as to equalize the inputted two electric potentials, and the current detecting unit detects a voltage across the sensing resistor, thereby carrying out detection of the current in the bidirectional switch through the difference voltage detector 11.

A current detection circuit of a bidirectional switch according to a second aspect of the invention is provided so that, in the current detection circuit of a bidirectional switch according to the first aspect, the feedback amplifying unit is formed of an operational amplifier (OP 1), which is provided with two input terminals of positive and negative and an output terminal, has one of the two input terminals connected to the other end of the series connection of the two main transistors, has the other input terminal connected to the other end of the series connection of the two mirror transistors, has the output terminal connected through the sensing resistor to the other input terminal that is connected to the other end of the series connection of the two mirror transistors, and has power supplied from two power sources (VDD, −VDD) with one having a positive potential and the other having a negative potential to the potential of the one of the electrodes of the main direct current power source.

A current detection circuit of a bidirectional switch according to a third aspect of the invention is provided so that, in the current detection circuit of a bidirectional switch according to the first aspect or the second aspect, the two main transistors and the two mirror transistors are made of MOSFET's of the same channel type, and the diode connected to each of the main transistors and the mirror transistors in parallel is a parasitic diode.

Moreover, a current detection circuit of a bidirectional switch according to a fourth aspect of the invention is provided so that, in the current detection circuit of a bidirectional switch according to the third aspect, the two main transistors and the two mirror transistors are made of N-channel MOSFET's, and both of the one end of the series connection of the two main transistors and the one end of the series connection of the two mirror transistors are connected to a negative electrode of the main direct current power source.

A current detection circuit of a bidirectional switch according to a fifth aspect of the invention is provided so that, in the current detection circuit of a bidirectional switch according to the third aspect, the two main transistors and the two mirror transistors are made of P-channel MOSFET's, and both of the one end of the series connection of the two main transistors and the one end of the series connection of the two mirror transistors are connected to a positive electrode of the main direct current power source.

Moreover, a current detection circuit of a bidirectional switch according to a sixth aspect of the invention is provided so that, in the current detection circuit of a bidirectional switch according to any one of the third aspect to the fifth aspect the parasitic diode (D3, D4) is formed so as to allow the current flowing in the parasitic diode to have the above-described specified mirror ratio to the current simultaneously flowing in the parasitic diode (D1, D2) connected to the main transistor in parallel.

Furthermore, a current detection circuit of a bidirectional switch according to a seventh aspect of the invention is provided so that, in the current detection circuit of a bidirectional switch according to any one of the first aspect to the sixth aspect, at least the two main transistors, the two mirror transistors and the feedback amplifying unit are formed of semiconductor integrated circuits.

The current detection circuit of a bidirectional switch according to the invention is as follows.

Namely, there are provided a bidirectional main switch, a bidirectional mirror switch and an operational amplifier. The bidirectional main switch includes two main switches each being formed of a main transistor. The a bidirectional mirror switch includes two mirror switches each being formed of a mirror transistor that is formed so as to allow a small current (a mirror current) to flow therein in a specified ratio to a current in the main transistor. The operational amplifier forms a feed back amplifying circuit having power supplied from two power sources of positive and negative, is connected between the end of the bidirectional main switch and the end of the bidirectional mirror switch, and allows the mirror current to flow in the bidirectional mirror switch through a sensing resistor so as to equalize voltages at the ends of the two bidirectional switches. With the detection circuit, the mirror current, consequently a current in the bidirectional main switch, is detected from a voltage across the sensing resistor by a simple circuit with low power losses and a high accuracy.

Moreover, a layout of elements of the bidirectional main switch and elements of the bidirectional mirror switch on a semiconductor substrate is carried out so that the current in the parasitic diode of the mirror transistor forming the mirror switch and the current in the parasitic diode of the main transistor forming the main switch also flow in an accurate mirror ratio. This also enables accurate detection of a parasitic diode current in the current passing mode of the parasitic diode.

According to the invention, the bidirectional main switch and the bidirectional mirror switch were combined. The bidirectional main switch has a role of cutting off an excessive charge current to and an excessive discharge current from a direct current power source such as a battery. The bidirectional mirror switch is formed so as to flow a small current (a mirror current) in a specified mirror ratio to the current flowing the bidirectional main switch. Furthermore, an operational amplifier was provided. The operational amplifier has power supplied from two power sources of positive and negative and allows the mirror current to flow in the bidirectional mirror switch through a sensing resistor so as to equalize voltages at the ends of the bidirectional main switch and the bidirectional mirror switch. This made the mirror current, consequently a current in the bidirectional main switch, detected from a voltage across the sensing resistor.

Thus, a current in the bidirectional main switch (a charge current to or a discharge current from a battery) can be detected with low power losses and a high accuracy while the current detection circuit is simplified.

In addition, a layout of elements of the bidirectional main switch and elements of the bidirectional mirror switch on the semiconductor substrate was carried out so that the current in the parasitic diode of the mirror transistor forming the mirror switch and the current in the parasitic diode of the main transistor forming the main switch also flow in an accurate mirror ratio. This enables accurate detection of a parasitic diode current even when an operation mode becomes in the mode of passing a current in the parasitic diode to make it possible to cut off also an excessive parasitic diode current.

DESCRIPTION OF THE PREFERRED EMBODIMENT

Figure 1:
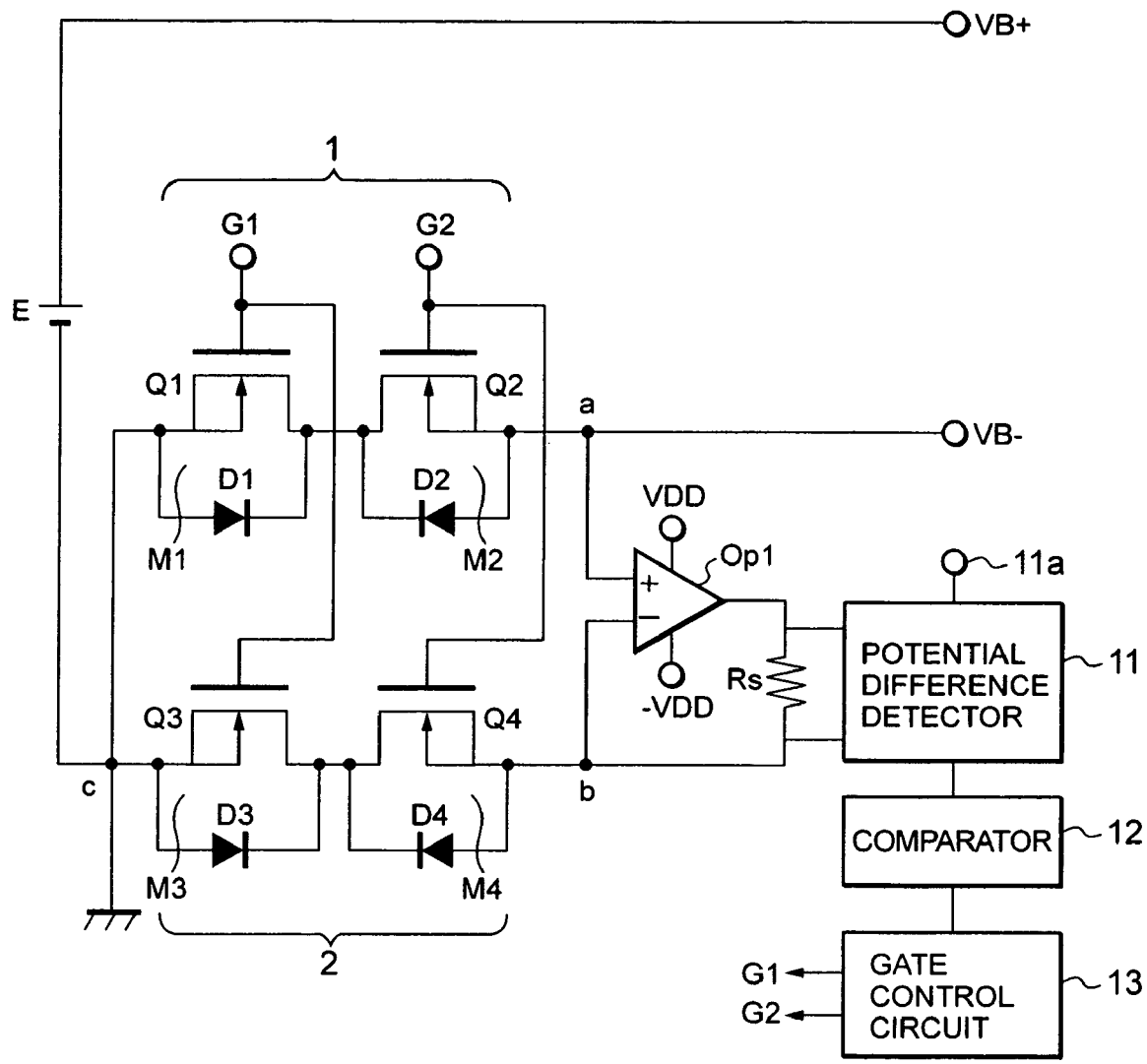
FIG. 1 is a circuit diagram showing a configuration of a current detection circuit of a bidirectional switch as an example according to the invention.
Figure 5:
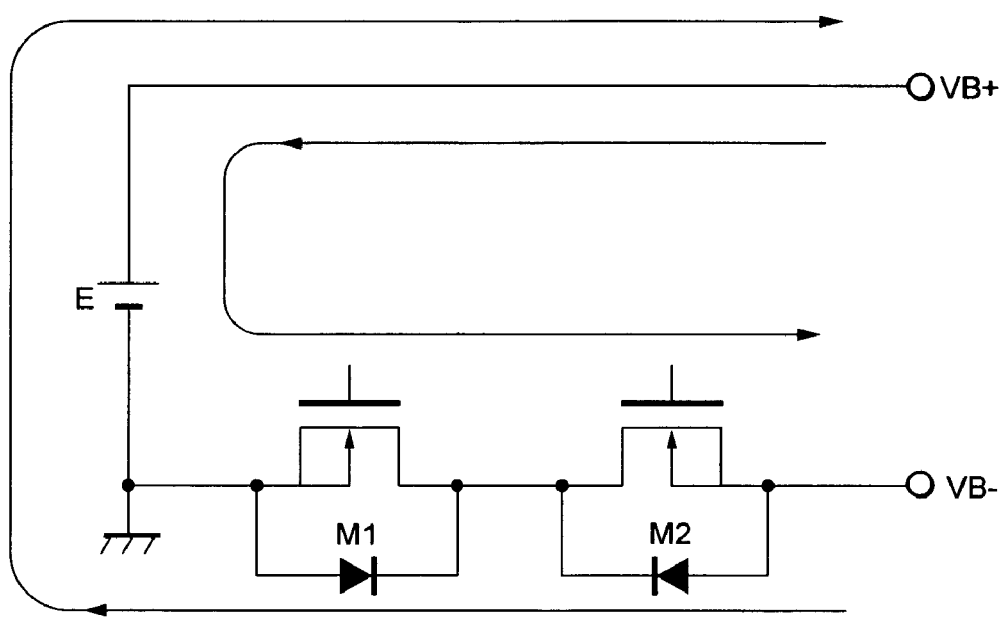
FIG. 5 is a diagram showing an example of an ordinary configuration of a bidirectional switch.

FIG. 1 is a circuit diagram showing a configuration of a current detection circuit of a bidirectional switch as one embodiment of the invention. In FIG. 1, to a series connection of main switches M1 and M2, each including (preferably) an N-channel MOSFET, and a series connection of mirror switches M3 and M4, each including (preferably) an N-channel MOSFET, are arranged in parallel. The series connection of main switches M1 and M2 forms a bidirectional main switch 1 somewhat like that in FIG. 5 and the series connection of mirror switches M3 and M4 forms a mirror circuit 2 of the main switches M1 and M2. Like the series connection of the main switches M1 and M2, the mirror switches M3 and M4 are also connected in series with their polarities being reversed to each other. The gate of the mirror switch M3 is connected to the gate of the mirror switch M1 to make their gate voltages equal to each other. Moreover, the gate of the mirror switch M4 is connected to the gate of the mirror switch M2 to make their gate voltages equal to each other. Herein, the series connection of the mirror switches M1 and M2 is referred to as a bidirectional mirror switch.

The main switches M1 and M2 exactly include the N-channel MOSFET's Q1 and Q2 and their parasitic diodes D1 and D2, respectively. Similarly, the mirror switches M3 and M4 include the n-channel MOSFET's Q3 and Q4 and their parasitic diodes D3 and D4, respectively.

In the example, source terminals (at point "c") of the main switch M1 and the mirror switch M3 are both connected to a negative terminal of a battery E and are held at ground potential. Meanwhile, a source terminal (at point "a") of the main switch M2 is connected to an external terminal VB− on its negative side. A positive terminal of the battery E is connected to an external terminal VB+ on its positive side. Across the external terminals VB+ and VB−, a charging device (not shown) is connected (so that its positive terminal side meets the external terminal VB+ side) when the battery E is charged. When the battery E is discharged, a load (not shown) is connected.

Meanwhile, between a source terminal (at point "a") of the main switch M2 and a source terminal (at point "b") of the mirror switch M4, an operational amplifier Op1 is provided. The voltages of the source terminals at the points "a" and "b" are inputted to the positive (+) input terminal and the negative (−) input terminal, respectively, of the operational amplifier Op1. Each has, on the input side, a high input impedance. The operational amplifier Op1 amplifies the difference voltage between the two source terminal voltages "a" and "b" to provide a series connection of the mirror switches M3 and M4 and a current through a sensing resistor Rs from the output side, with a low output impedance so that the difference voltage is maintained at zero.

In the circuit shown in FIG. 1, when the battery E is charged, a charge current flows through the path from the external terminal VB+ to the external terminal VB− via the battery E, the main switch M1 and the main switch M2. This makes the electric potential at the point "a" become negative to the ground potential (at a connection point "c"). When the battery E is discharged, a discharge current flows through the path from the external terminal VB− to the external terminal VB+ via the main switch M2, the main switch M1 and the battery E. This makes the electric potential at the point "a" become positive to the ground potential (at connection point "c")

It is necessary for the operational amplifier Op1, performing a feedback-amplifying operation, to operate so that the electric potentials at points "a" and "b" are made equal to each other at both charging and discharging. Therefore, when the battery E is charged, it is necessary for the operational amplifier Op1 to have a current flow in from the mirror switches M3 and M4 through the sensing resistor Rs. Meanwhile, when the battery E is discharged, it is necessary for the operational amplifier Op1 to make a current flow into the mirror switches M3 and M4 through the sensing resistor Rs. That is, when the battery E is charged, the output voltage of the operational amplifier Op1 must be negative relative to ground potential (at point "c") and, when the battery E is discharged, it must be positive relative to ground potential.

Therefore, in the invention, power source voltages supplied to the operational amplifier Op1 preferably are not zero voltage (OV) and a positive voltage (VDD), but instead are voltages supplied from two kinds of negative and positive power sources such as a positive voltage VDD and a negative voltage −VDD, respectively. By using a negative voltage supply, the output voltage of the operational amplifier Op1 is able to range from a positive voltage to a negative voltage below ground potential. If only a positive voltage is externally supplied, then, for obtaining a negative voltage, another battery is internally used or a built-in power supply circuit is provided which generates a negative voltage from the supplied positive voltage.

In the current detection circuit shown in FIG. 1, the value of the voltage difference across the sensing resistor Rs is obtained by a difference voltage detector 11, which thereby indirectly measures the current flowing in the sensing resistor Rs, and, consequently, the value of a current passing through the main switches M1 and M2. By distinguishing the polarity of the difference voltage, the direction of the current in the main switches can also be detected, to distinguish between a charging state and a discharging state.

Moreover, the value of the measured current (the value of the output of the difference voltage detector 11, that is also a value of a measured current 11a) is compared with a specified value (by comparator 12). When the value of the measured current exceeds the specified current value, the output of the comparator 12 operates a gate control circuit 13 to drive the gates G1 and G2 of the bidirectional main switches (and the mirror switches). Thus, the bidirectional switch can be controlled so as to be turned off.

For example, when an over-discharge current flows due to a short-circuit in an external circuit (not shown), the gate G1, and consequently the switches M1 and M3, are driven to the turned-off state while keeping the gate G2, and consequently the switches M2 and M4, in the turned-on state. Meanwhile, if the battery E is damaged so as to be short-circuited, the gate G2, and consequently the switches M2 and M4, are driven to the turned-off state while keeping the gate G1, and consequently the switches M1 and M3, in the turned-on state. Thus, an excessive current can be prevented.

Figure 2A:
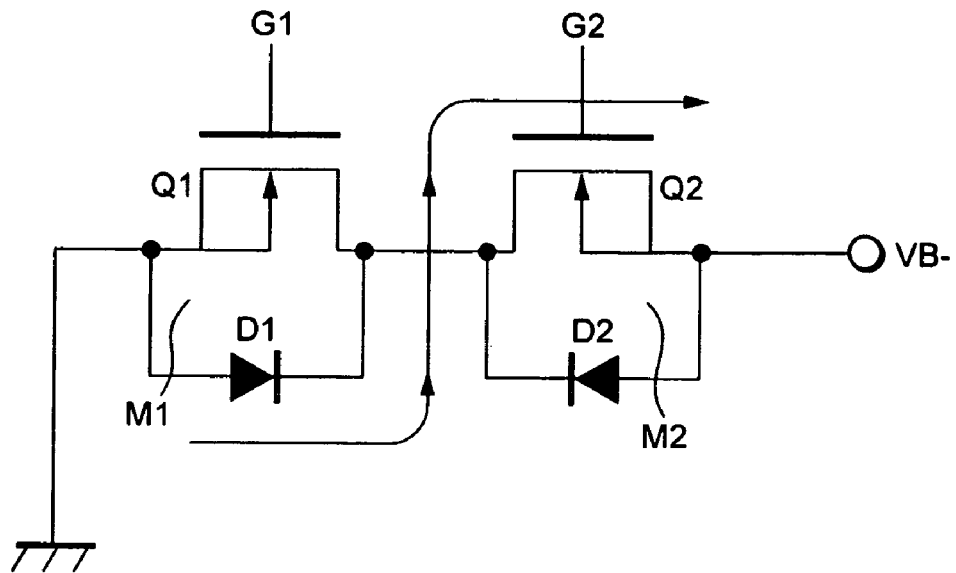
FIG. 2A is an explanatory diagram showing a current passing mode of a parasitic diode in an over-discharge disable and charge enable mode in an N-channel bidirectional main switch in FIG. 1.
Figure 2B:
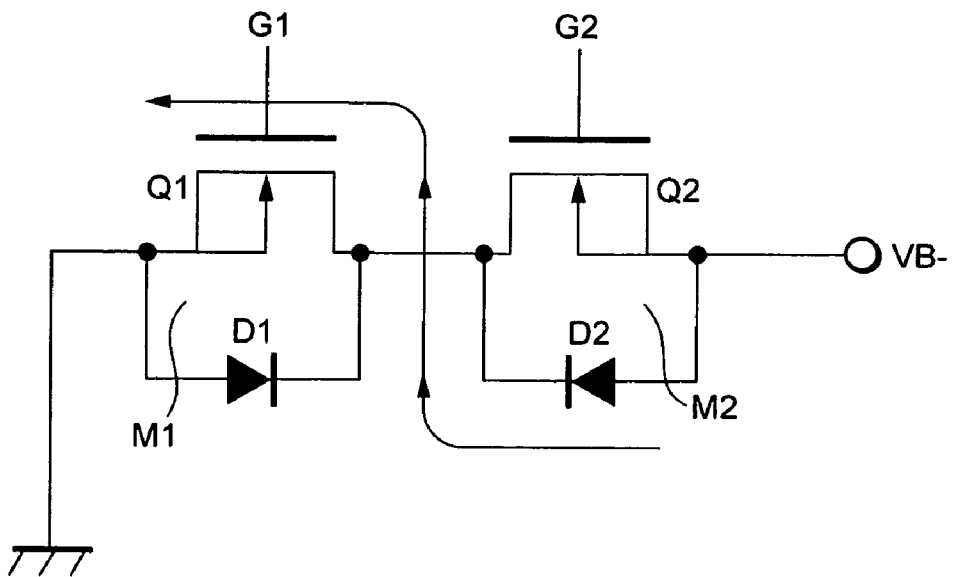
FIG. 2B is an explanatory diagram showing a current passing mode of a parasitic diode in an over-charge disable and discharge enable mode in an N-channel bidirectional main switch in FIG. 1.
Figure 3:
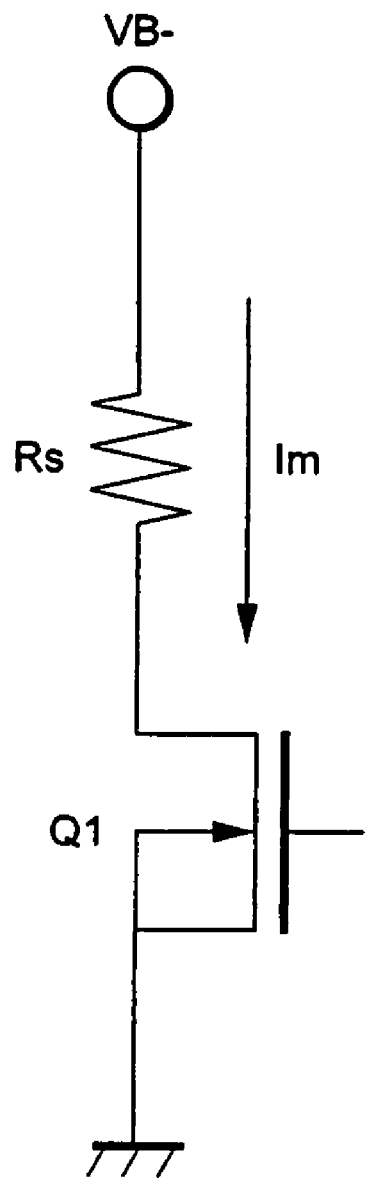
FIG. 3 is a diagram showing an example of a configuration of a related current detection circuit.
Figure 4:
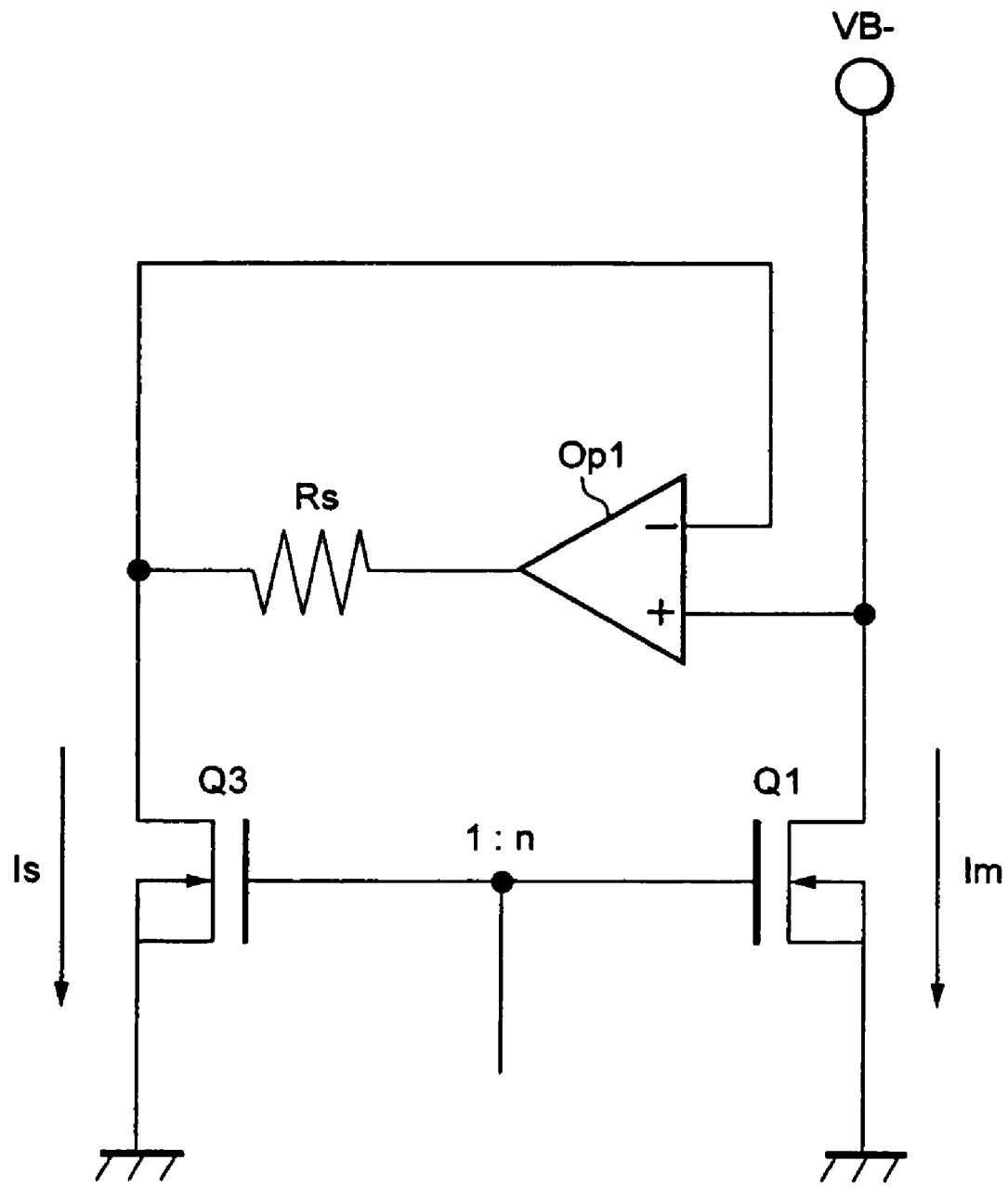
FIG. 4 is a diagram showing another example of a configuration of a related current detection circuit.

With this invention, it is possible to also carry out detection of an overcurrent flowing in the parasitic diode, which was not previously taken into consideration, to cut off the current. Each of FIGS. 2A and 2B is an explanatory diagram showing such a mode of passing a current in the parasitic diode. In both of FIGS. 2A and 2B, for the purpose of simplification, there are shown only the main switches M1 and M2 on the side of the bidirectional main switch shown in FIG. 1.

In FIG. 2A, the bidirectional main switch is in an over-discharge-disable and charge-enable mode, that is, in a state in which the gate G1 is driven to a turned-off state and the gate G2 is driven to the turned-on state. In this situation, the discharge current is blocked but the charge current is allowed to flow through the path from the parasitic diode D1 in the main switch M1 to the main switch M2.

The current flowing in the parasitic diode D1 can be detected by detecting a current simultaneously flowing into the sensing resistor Rs through the path from the parasitic diode D3 to the mirror switch M4 (see FIG. 1) on the side of the bidirectional mirror switch provided in parallel with the bidirectional main switch. The overcurrent in the parasitic diode D1 can be cut off by further driving the gate G2 to the turned-off state.

Similarly, in FIG. 2B, the bidirectional main switch is in an overcharge-disable and discharge-enable mode, that is, in a state in which the gate G1 is driven to the turned-on state and the gate G2 is driven to the turned-off state. In this situation, the charge current is blocked but the discharge current is allowed to flow through the path from the parasitic diode D2 in the main switch M2 to the main switch M1.

Also, the current flowing in the parasitic diode D2 can be detected by detecting current simultaneously flowing out from the sensing resistor Rs through the path from the parasitic diode D4 to the mirror switch M3 (see FIG. 1) on the side of the bidirectional mirror switch that is in parallel with the bidirectional main switch. The overcurrent in the parasitic diode D2 can be cut off by further driving the gate G1 to the turned-off state.

In this case, the ratio of a mirror current that is due to the current-to-voltage characteristic of the parasitic diode lying in the current path in the bidirectional mirror switch, to a main current, that is due to the current-to-voltage characteristic of the parasitic diode lying in the current path in the bidirectional main switch, must be taken as being equal to the mirror ratio. Therefore, the respective ratios of the areas of the source region, the drain region and the substrate contact region in the current path in the bidirectional mirror switch to the areas of corresponding regions, the source region, the drain region and the substrate contact region, in the current path in the bidirectional main switch are accurately taken as the mirror ratio.

Specifically, for making the respective current values in the current to voltage characteristics of the N-channel MOSFET's Q1 and Q3 (and Q2 and Q4) proportional to each other, it is important to make the ratio of the W length of the N-channel MOSFET Q3 to that of the n-channel MOSFET Q1 and the ratio of the W length of the n-channel MOSFET Q4 to that of the N-channel MOSFET Q2 match the mirror ratio. Meanwhile, for making the respective current values in the current to voltage characteristics of the diodes parasitic D1 and D3 (and D2 and D4) proportional to each other, it becomes important to make the ratio of the facing area of a p-region and an n-region in the p-n junction of the diode D3 to that of the diode D,1 and the ratio of the facing area of a p-region and an n-region in the p-n junction of the diode D4 to that of the diode D2, match the mirror ratio.

With the ratio of the current values in the respective current to voltage characteristics of diodes D3 and D1 (and D2 and D4) completely matching the mirror ratio, when applied voltages across the respective diode D1 and diode D3 (or applied voltages across the respective diode D2 and diode D4) are equal, the ratio of the value of the diode current of the diode D3 to the value of the diode current of the diode D1 (or the ratio of the value of the diode current of the diode D4 to the value of the diode current of the diode D2) also becomes equal to the mirror ratio. Therefore, the value of the current in the current path in the bidirectional mirror switch is proportional to the value of the current in the current path in the bidirectional main switch even when the n-channel MOSFET's in both switches are in a turned-off state.

The bidirectional switch can be not only of a type in which the source of one n-channel MOSFET is connected to the external terminal with the drains of the two n-channel MOSFET's connected in common as shown in FIG. 1, but also of a type in which the drain of one n-channel MOSFET is connected to the external terminal with the sources of the two N-channel MOSFET's connected in common. Moreover, the detection circuit can be not only of a type in which the N-channel bidirectional switch is inserted on the negative terminal side of the battery E, but also of a type in which a P-channel bidirectional switch is inserted on the positive terminal side of the battery E.

Furthermore, when one end of the bidirectional switch is connected to the positive terminal side of the battery E, the power sources VDD and −VDD for the operational amplifier Op1 must be in a negative potential and a positive potential, respectively, to the potential of the positive terminal of the battery E.

While the present invention has been particularly shown and described with reference to the preferred embodiment thereof, it will be understood by those skilled in the art that the foregoing and other changes in form and details can be made therein without departing from the spirit and scope of the present invention.

What is claimed is:

1. A bidirectional-switch current detection circuit for a direct current power source, comprising:
    (a) a main bidirectional switch comprising
    two main transistors connected in series and being reversed in polarity with respect to one another, each main transistor comprising a respective parasitic diode connected thereto in parallel,
    the main bidirectional switch being insertable into a current path of the power source;
    (b) a mirror bidirectional switch comprising
    two mirror transistors connected in series and being reversed in polarity with respect to one another, each main transistor comprising a respective parasitic diode connected thereto in parallel;
    (c) a sensing resistor;
    (d) a feedback amplifying unit comprising two high impedance inputs and an output, wherein the output is coupled to the sensing resistor and
    wherein the main bidirectional switch and the mirror bidirectional switch are connected in parallel between the feedback amplifying unit and a connection point included, with the main bidirectional switch, in the current path of the power source,
    wherein each of the main bidirectional switch and the mirror bidirectional switch is connected to a respective one of the high impedance inputs at the feedback amplifying unit, and
    wherein the output of the feedback amplifying unit is connected through the sensing resistor to the high impedance input that is connected to the mirror bidirectional switch; and
    (e) a current detecting unit detecting a voltage across the sensing resistor, thereby carrying out detection of current in the main bidirectional switch; wherein
    each mirror transistor is formed such that a mirror current flowing therein, which is smaller than a main current flowing in a main transistor having the same polarity as that mirror transistor, is in a specified mirror ratio of the mirror current to the main current, when electric potentials of main electrodes of that mirror transistor and the main transistor having the same polarity are made equal.

2. The bidirectional-switch current detection circuit as claimed in claim 1, wherein at least the two main transistors, the two mirror transistors and the feedback amplifying unit are comprised of semiconductor integrated circuits.

3. The bidirectional-switch current detection circuit as claimed in claim 1, wherein the two main transistors and the two mirror transistors are made of MOSFET's of a same channel type, and the diode connected to each of the main transistors and the mirror transistors in parallel is a parasitic diode.

4. The bidirectional-switch current detection circuit as claimed in claim 3, wherein at least the two main transistors, the two mirror transistors and the feedback amplifying unit are comprised of semiconductor integrated circuits.

5. The bidirectional-switch current detection circuit as claimed in claim 3, wherein the parasitic diode is formed such that the current flowing in the parasitic diode has the mirror ratio to the current simultaneously flowing in the parasitic diode connected in parallel to the main transistor.

6. The bidirectional-switch current detection circuit as claimed in claim 5, wherein at least the two main transistors, the two mirror transistors and the feedback amplifying unit are comprised of semiconductor integrated circuits.

7. The bidirectional-switch current detection circuit as claimed in claim 3, wherein the two main transistors and the two mirror transistors are made of n-channel MOSFET's, and both one end of the series connection of the two main transistors and one end of the series connection of the two mirror transistors are connected, through the connection point, to a negative electrode of the direct current power source.

8. The bidirectional-switch current detection circuit as claimed in claim 7, wherein at least the two main transistors, the two mirror transistors and the feedback amplifying unit are comprised of semiconductor integrated circuits.

9. The bidirectional-switch current detection circuit as claimed in claim 7, wherein the parasitic diode is formed such that the current flowing in the parasitic diode has the mirror ratio to the current simultaneously flowing in the parasitic diode connected in parallel to the main transistor.

10. The bidirectional-switch current detection circuit as claimed in claim 9, wherein at least the two main transistors, the two mirror transistors and the feedback amplifying unit are comprised of semiconductor integrated circuits.

11. The bidirectional-switch current detection circuit as claimed in claim 3, wherein the two main transistors and the two mirror transistors are made of p-channel MOSFET's, and both one end of the series connection of the two main transistors and one end of the series connection of the two mirror transistors are connected, through the connection point, to a positive electrode of the direct current power source.

12. The bidirectional-switch current detection circuit as claimed in claim 11, wherein at least the two main transistors, the two mirror transistors and the feedback amplifying unit are comprised of semiconductor integrated circuits.

13. The bidirectional-switch current detection circuit as claimed in claim 11, wherein the parasitic diode is formed such that the current flowing in the parasitic diode has the mirror ratio to the current simultaneously flowing in the parasitic diode connected in parallel to the main transistor.

14. The bidirectional-switch current detection circuit as claimed in claim 13, wherein at least the two main transistors, the two mirror transistors and the feedback amplifying unit are comprised of semiconductor integrated circuits.

15. The bidirectional-switch current detection circuit as claimed in claim 1, wherein the feedback amplifying unit comprises an operational amplifier, the two high impedance inputs are positive and negative terminals thereof, wherein the output comprises an output terminal thereof, and wherein one of the two input terminals is connected to an end of the series connection of the two main transistors, and the other input terminal is connected to an end of the series connection of the two mirror transistors, and the output terminal is connected through the sensing resistor to the input terminal that is connected to the end of the series connection of the two mirror transistors, and comprising two power sources connected to the operational amplifier, one having a positive potential and the other having a negative potential, the negative potential being negative with respect to the potential at the connection point where the main bidirectional switch is insertable into the current path of the power source.

16. The bidirectional-switch current detection circuit as claimed in claim 15, wherein at least the two main transistors, the two mirror transistors and the feedback amplifying unit are comprised of semiconductor integrated circuits.

17. The bidirectional-switch current detection circuit as claimed in claim 15, wherein the two main transistors and the two mirror transistors are made of MOSFET's of a same channel type, and the diode connected to each of the main transistors and the mirror transistors in parallel is a parasitic diode.

18. The bidirectional-switch current detection circuit as claimed in claim 17, wherein at least the two main transistors, the two mirror transistors and the feedback amplifying unit are comprised of semiconductor integrated circuits.

19. The bidirectional-switch current detection circuit as claimed in claim 17, wherein the parasitic diode is formed such that the current flowing in the parasitic diode has the mirror ratio to the current simultaneously flowing in the parasitic diode connected in parallel to the main transistor.

20. The bidirectional-switch current detection circuit as claimed in claim 19, wherein at least the two main transistors, the two mirror transistors and the feedback amplifying unit are comprised of semiconductor integrated circuits.

21. The bidirectional-switch current detection circuit as claimed in claim 17, wherein the two main transistors and the two mirror transistors are made of n-channel MOSFET's, and both one end of the series connection of the two main transistors and one end of the series connection of the two mirror transistors are connected, through the connection point, to a negative electrode of the direct current power source.

22. The bidirectional-switch current detection circuit as claimed in claim 21, wherein at least the two main transistors, the two mirror transistors and the feedback amplifying unit are comprised of semiconductor integrated circuits.

23. The bidirectional-switch current detection circuit as claimed in claim 21, wherein the parasitic diode is formed such that the current flowing in the parasitic diode has the mirror ratio to the current simultaneously flowing in the parasitic diode connected in parallel to the main transistor.

24. The bidirectional-switch current detection circuit as claimed in claim 23, wherein at least the two main transistors, the two mirror transistors and the feedback amplifying unit are comprised of semiconductor integrated circuits.

25. The bidirectional-switch current detection circuit as claimed in claim 17, wherein the two main transistors and the two mirror transistors are made of p-channel MOSFET's, and both one end of the series connection of the two main transistors and one end of the series connection of the two mirror transistors are connected, through the connection point, to a positive electrode of the direct current power source.

26. The bidirectional-switch current detection circuit as claimed in claim 25, wherein at least the two main transistors, the two mirror transistors and the feedback amplifying unit are comprised of semiconductor integrated circuits.

27. The bidirectional-switch current detection circuit as claimed in claim 25, wherein the parasitic diode is formed such that the current flowing in the parasitic diode has the mirror ratio to the current simultaneously flowing in the parasitic diode connected in parallel to the main transistor.

28. The bidirectional-switch current detection circuit as claimed in claim 27, wherein at least the two main transistors, the two mirror transistors and the feedback amplifying unit are comprised of semiconductor integrated circuits.

* * * * *